(12) United States Patent
Colombo et al.

(10) Patent No.: US 10,181,516 B2
(45) Date of Patent: Jan. 15, 2019

(54) GRAPHENE FET WITH GRAPHITIC INTERFACE LAYER AT CONTACTS

(71) Applicant: Texas Instruments Incorporated, Dallas, TX (US)

(72) Inventors: Luigi Colombo, Dallas, TX (US); Archana Venugopal, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/865,795

(22) Filed: Jan. 9, 2018

(65) Prior Publication Data

US 2018/0130882 A1 May 10, 2018

Related U.S. Application Data

(62) Division of application No. 14/933,872, filed on Nov. 5, 2015, now Pat. No. 9,882,008.

(51) Int. Cl.
| | |
|---|---|
| *H01L 29/06* | (2006.01) |
| *H01L 29/16* | (2006.01) |
| *H01L 29/786* | (2006.01) |
| *H01L 51/00* | (2006.01) |
| *H01L 51/05* | (2006.01) |
| *H01L 29/66* | (2006.01) |
| *H01L 29/45* | (2006.01) |

(Continued)

(52) U.S. Cl.
CPC .... *H01L 29/1606* (2013.01); *H01L 21/02244* (2013.01); *H01L 29/45* (2013.01); *H01L 29/66045* (2013.01); *H01L 29/66742* (2013.01); *H01L 29/778* (2013.01); *H01L 29/786* (2013.01); *H01L 51/0048* (2013.01); *H01L 51/0558* (2013.01); *H01L 29/517* (2013.01)

(58) Field of Classification Search
CPC .................................................. H01L 29/1606
USPC .......................................................... 257/29
See application file for complete search history.

(56) References Cited

U.S. PATENT DOCUMENTS

| | | | |
|---|---|---|---|
| 8,309,438 B2 | 11/2012 | Colombo et al. | |
| 8,461,028 B2 | 6/2013 | Colombo et al. | |

(Continued)

OTHER PUBLICATIONS

Yang Chai, et al., "Graphitic Interfacial Layer to Carbon Nanotube for Low Electrical Contact Resistance", International Electron Devices Meeting, 2010, p. 9.2.1-9.2.4.

*Primary Examiner* — Ajay K Arora
(74) *Attorney, Agent, or Firm* — Jacqueline J. Garner; Charles A. Brill; Frank D. Cimino

(57) ABSTRACT

A method for forming a graphene FET includes providing a graphene layer having a surface. A first metal layer having a work function <4.3 eV is deposited on the graphene surface. The first metal layer is oxidized to form a first metal oxide layer. The first metal oxide layer is etched to provide open surface contact regions including a first and a second region of the graphene layer for providing a graphene surface source and drain contact. A second metal layer is deposited including a second metal layer portion providing a source with a source contact over the graphene surface source contact and a second metal layer portion providing a drain with a drain contact over the graphene surface drain contact. A grown-in graphitic interface layer is formed at an interface between the source contact and graphene surface source contact and the drain contact and graphene surface drain contact.

20 Claims, 4 Drawing Sheets

(51) Int. Cl.
*H01L 21/02* (2006.01)
*H01L 29/778* (2006.01)
*H01L 29/51* (2006.01)

(56) References Cited

U.S. PATENT DOCUMENTS

| | | |
|---|---|---|
| 8,895,417 B2 | 11/2014 | Afzali-Ardakani et al. |
| 2011/0042649 A1* | 2/2011 | Duvall .................. B82Y 10/00 257/27 |
| 2012/0181506 A1 | 7/2012 | Farmer et al. |
| 2012/0298949 A1 | 11/2012 | Chang et al. |
| 2013/0240839 A1 | 9/2013 | Avouris et al. |
| 2013/0248823 A1 | 9/2013 | Bol et al. |
| 2014/0261998 A1 | 9/2014 | Veerasamy |
| 2015/0214303 A1 | 7/2015 | Ruhl et al. |

* cited by examiner

GRAPHENE FET WITH GRAPHITIC INTERFACE LAYER AT CONTACTS

CROSS REFERENCE TO RELATED APPLICATIONS

This application is a divisional of U.S. Nonprovisional patent application Ser. No. 14/933,872, filed Nov. 5, 2015 the contents of which are herein incorporated by reference in its entirety.

FIELD

Disclosed embodiments relate to graphene and carbon nanotube (CNT)-based devices.

BACKGROUND

Graphene and carbon nanotube (CNT)-based devices are candidates for applications such as analog devices and various types of sensors. One factor adversely affecting the performance of these devices is the contact resistance arising at the metal/graphene or CNT interface which is generally a non-wetting/non-reacting interface. This contact resistance is generally a significant contributor to mobility degradation in short channel graphene and CNT field effect transistor (FET) devices and a potential source of device noise.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments recognize contact resistance substantially limits the minimum ON resistance for graphene and carbon nanotube (CNT) channel-based field effect transistors (FETs). Contributing factors to this contact resistivity include residue from transfer and fabrication, perturbation of the graphene sheet or CNT surface by the metal, and in some cases presence of OH or O in metals as is the case for some low work function metals which can lead to high resistance contacts. Typical reported contact resistivities for graphene are in the range from $10^{-5}$ to $10^{-6}$ $\Omega$-cm$^2$. In comparison, the contact resistivity of silicided Ni or Pt contacts to silicon has been measured to be as low as $10^{-8}$ $\Omega$-cm.

Disclosed methods include cleaning the graphene surface of organic residues using a deposited low work function metal followed by selective removal of the low work function metal material (e.g., in its oxidized form) in the contact regions by wet etching. A grown-in graphitic interface layer is then formed in the contact regions (at the source/drain contacts) between the contact metal (referred to herein as a second metal layer) and the graphene surface source and drain contact to provide low contact resistance to the graphene surface, which also minimizes the effect of extrinsic effects/contamination. The graphene layer can be in the form of CNTs.

BRIEF DESCRIPTION OF THE DRAWINGS

Reference will now be made to the accompanying drawings, which are not necessarily drawn to scale, wherein.

DETAILED DESCRIPTION

Figure 1:
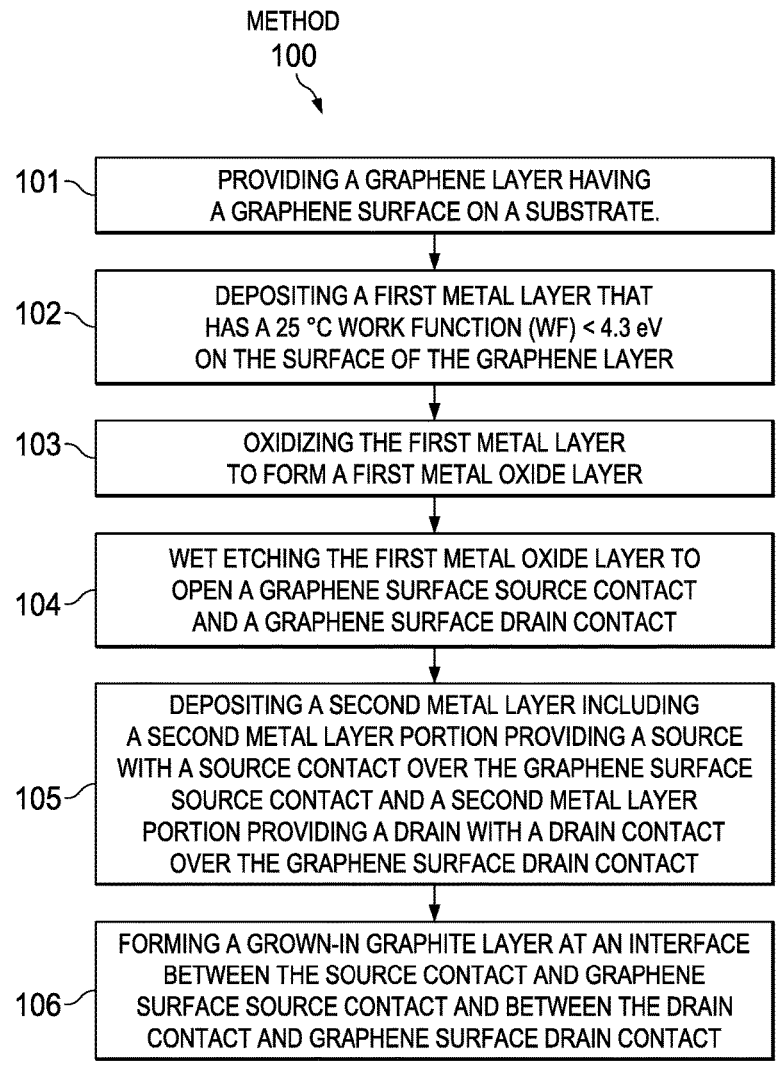
FIG. 1 is a flow chart that shows steps in an example method for forming a graphene or CNT-based FET having a graphitic interface layer at its source (S) and drain (D) contacts, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1 is a flow chart that shows steps in an example method 100 for forming a graphene-based FET having a graphitic interface layer at its S and D contacts, according to an example embodiment. As used herein the "graphite layer" in a disclosed "grown-in graphite layer" refers to 2 or more graphene layers stacked on one another positioned at the contact region for the source and drain between the contact metal and the graphene or CNT surface. Disclosed grown-in graphite layers are pure graphitic C/multilayer graphene, not a combination of graphitic C and amorphous carbon (a-C). Each graphene layer in a disclosed grown-in graphite layer comprises carbon atoms densely packed in a regular atomic-scale hexagonal structure where each C atom has four bonds, one $\sigma$ bond with each of its three neighbors and one $\pi$-bond that is oriented out of plane. The C atoms are about 1.42 Å apart in a honeycomb lattice, and the interplanar spacing is about 3.35 Å, so that an example 5 layer graphitic interface is about 16.7 Å thick.

Step 101 comprises providing a graphene layer having a graphene surface on a substrate. The graphene layer can be in a form carbon nanotube (CNTs). As known in the art of material science, a graphene sheet can be rolled to form another allotrope of carbon called a CNT. The CNTs can be single-walled nanotubes (SWNTs) or multi-walled nanotubes (MWNTs) comprising multiple rolled layers (concentric tubes) of graphene.

Figure 2A:
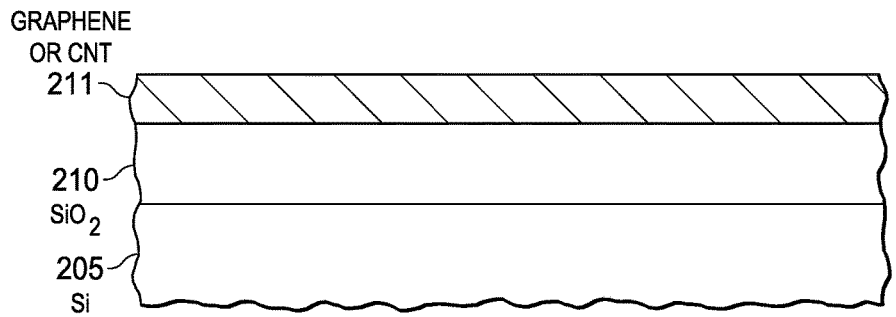
FIGS. 2A-2H are cross-sectional diagrams showing processing progression for an example method of forming a graphene or CNT FET having a graphitic interface layer at its S and D contacts, according to an example embodiment.

The substrate can comprise a wafer comprising silicon or other substrates (e.g. fused quartz, SiC, or GaAs) having a dielectric layer thereon such as SiO$_2$ (silica), SiON, Si$_3$N$_4$, h-BN, GaN or a transition metal dichalcogenide. FIG. 2A is a cross sectional depiction showing a graphene or CNT layer 211 on a SiO$_2$ layer 210 on a silicon substrate 205. The surface of the graphene or CNT layer 211 may be cleaned using an Ultra High Vacuum (UHV) clean process, such as at a temperature of about 300° C. for about 3 hours.

Step 102 comprises depositing a first metal layer that has a 25° C. work function (WF)<4.3 eV on the surface of the graphene or CNT layer 211. The thickness of the first metal layer may for example be 1.5 nm to 3 nm. The first metal layer can comprise Al, Ti, Hf, Zr, V, Y, La, Ce, Pr, Nd, Pm, Sm, Eu, Gd, Tb, Dy, Ho, Er, Tm, Yb, or Lu. The first metal material being a low work function metal is recognized to reduce the surface of the graphene or CNT to incorporate therein contamination on the surface of the graphene or CNT layer 211.

Figure 2B:
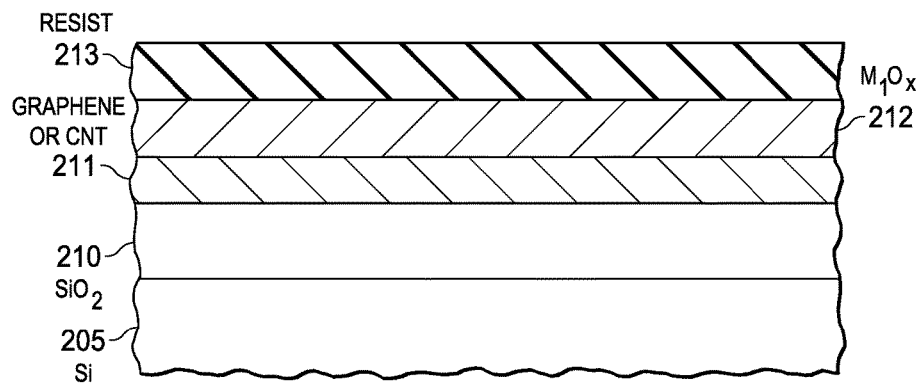

Step 103 comprises oxidizing the first metal layer to form a first metal oxide layer. The oxidation can take place in air or in a controlled oxidizing environment, such as at an oxygen ($O_2$) partial pressure from $10^{-8}$ Torr to 1 atm, and in a temperature range of room temperature to about 400° C. This oxidization process oxidizes the first metal layer throughout its thickness. FIG. 2B is a cross sectional depiction showing a layer of photoresist (resist) 213 on a first metal oxide layer 212 on the graphene or CNT layer 211 on a $SiO_2$ layer 210 on the silicon substrate 205. The layer of resist 213 is then patterned using a lithography process.

Figure 2C:
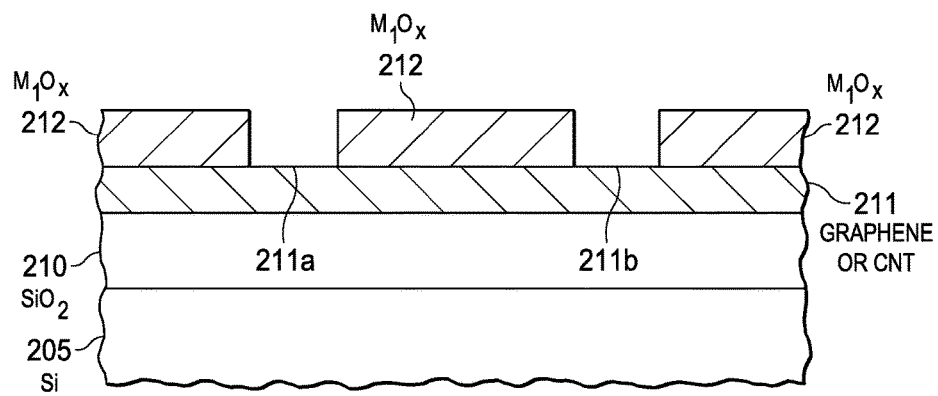

Step 104 comprises etching the first metal oxide layer 212 to provide open surface contact regions including a first and a second region of the graphene layer for providing a graphene surface source contact 211a and a graphene surface drain contact 211b, respectively. A dilute HF solution, such as 100:1 water:concentrated HF can be used for wet etching the first metal oxide layer 212. A dry etch may also be used. FIG. 2C shows a cross sectional view after wet etching to open contact a graphene surface source and drain contact regions 211a, 211b through the first metal oxide layer 212, and then removing the resist layer 213.

Figure 2D:
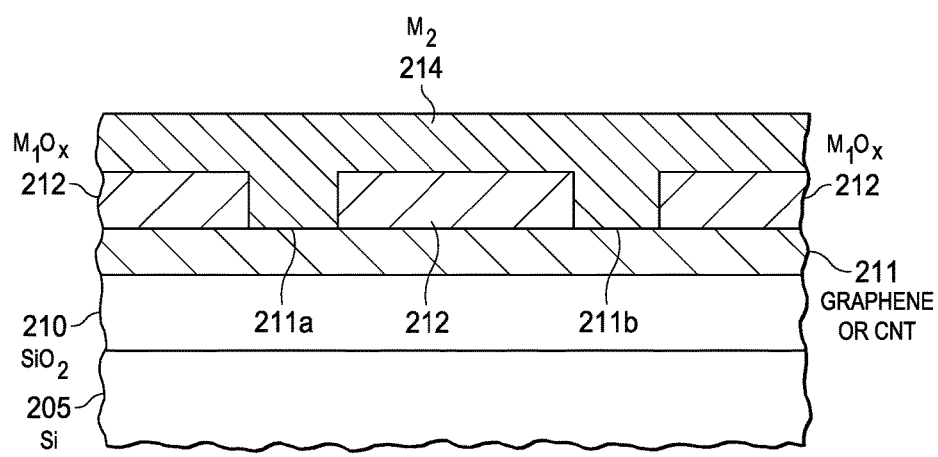

Step 105 comprises forming a second metal layer 214 including a second metal layer portion 214a providing a source with a source contact 214a1 over the graphene surface source contact 211a and a second metal layer portion 214b providing a drain with a drain contact 214b1 over the graphene surface drain contact 211b. The thickness of the second metal layer 214 can be for example from about 10 nm to 200 nm. FIG. 2D shows a cross sectional view after depositing the second metal layer 214 over the graphene or CNT layer 211. The second metal layer can comprise Ni, Co, Cu, Ru, Rh, or Pd. In some metals including Ni, Co, Cu, Ru, and Pd carbon is soluble at temperatures of >500° C., such as about 500° C. to 1000° C.

The depositing of the second metal layer 214 can comprise in-situ deposited carbon using a carbon precursor gas together with a second metal precursor gas, such as using a low pressure chemical vapor deposition (LPCVD) or plasma enhanced chemical vapor deposition (PECVD) system for the deposition. The carbon precursor gasses for LPCVD and PECVD processing can be obtained from a variety of carbon precursor materials, such as methane ($CH_4$) or acetylene ($C_2H_2$) as example gas sources, ethanol or ethylene as example liquid sources, and sugar or camphor as example solid sources, which can each be heated or plasma source activated to generate C species.

Figure 2E:
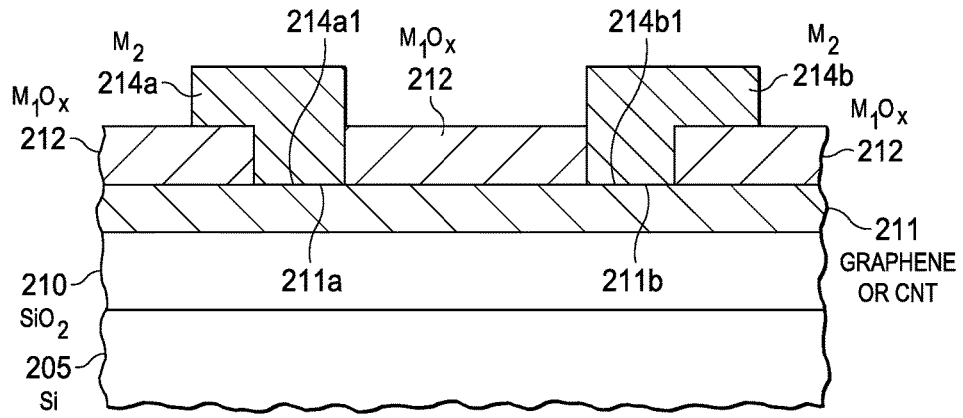

In the case of LPCVD and PECVD carbon precursor gas vapors can be introduced in-situ within the second metal layer 214 at a temperature in the range from 200° C. to 1,000° C., with the process temperature selected based on the decomposition temperature of the carbon precursor gas or other C source material. The resulting second metal layer 214 can be pre-saturated with C throughout its thickness to have a C concentration of $\geq 10^{17}$ cm$^{-3}$. FIG. 2E shows a cross sectional view after patterning the second metal layer 214 to provide the second metal layer portion 214a providing a source with a source contact 214a1 over the graphene surface source contact 211a and a second metal layer portion 214b providing a drain with a drain contact 214b1 over the graphene surface drain contact 211b. A wet or dry etch may be used to pattern the second metal layer 214.

Step 106 comprises forming a grown-in graphite layer at an interface between the between the source contact 214a1 and graphene surface source contact 211a and between the drain contact 214b1 and the graphene surface drain contact 211b. As noted above, disclosed grown-in graphite layers are pure graphitic C/multilayer graphene, not a combination of graphitic C and amorphous carbon (a-C). Typically, a disclosed grown-in graphite layer comprises two (2) to thirty (30) layers of graphene. However, disclosed grown-in graphite layers can comprise more than thirty (30) layers of graphene.

Figure 2F:
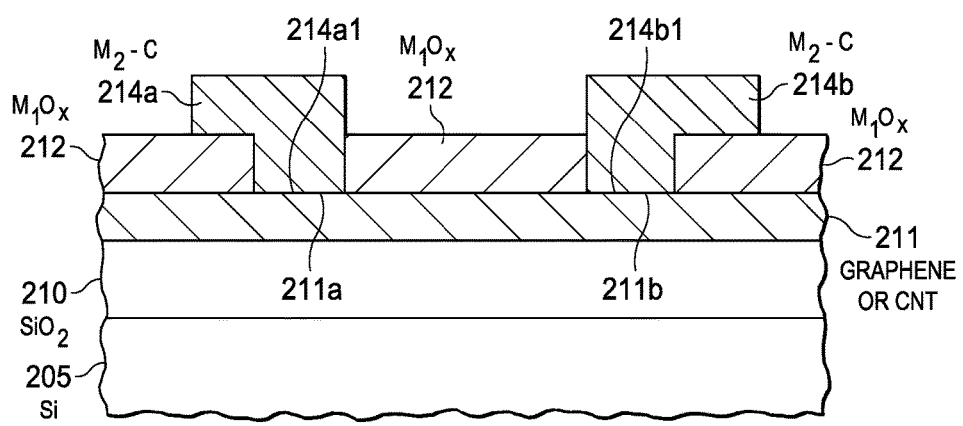
Figure 2G:
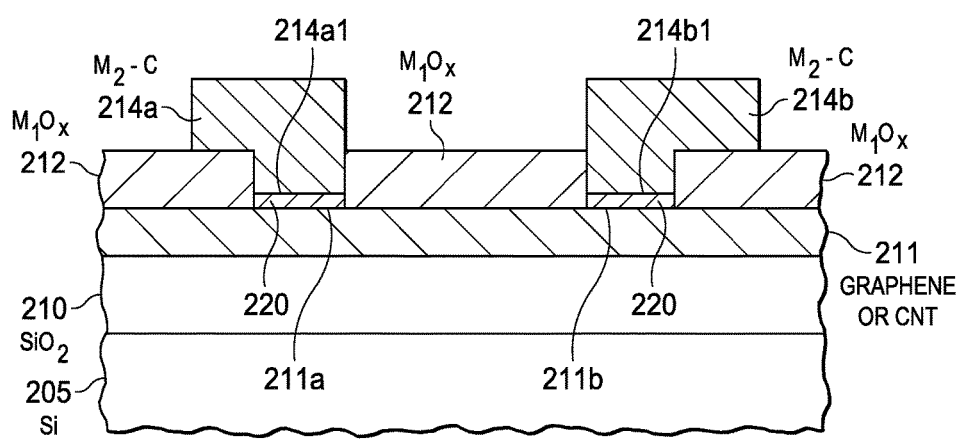

FIGS. 2F-2G describe a first process flow for forming a grown-in graphite layer at an interface between the source contact 214a1 and graphene surface source contact 211a and between the drain contact 214b1 and the graphene surface drain contact 211b. As noted above the grown-in graphite layer 2 or more graphene layers stacked on one another. FIG. 2F shows the patterned second metal layer 214 in FIG. 2E providing the second metal layer portion 214a providing a source with a source contact 214a1 and a second metal layer portion 214b providing a drain with a drain contact 214b1 both having C therein (shown as $M_2$-C) that can be provided as described above in-situ deposited in the second metal layer 214 using a PECVD or LPCVD process.

Carbon can also be provided in the second metal layer 214 by other carbon source processes. For example, carbon ion implantation can be used to introduce a desired amount of C into the second metal layer 214, such as disclosed in U.S. Pat. No. 8,461,028 to Colombo et al. entitled "Synthesizing graphene from metal-carbon solutions using ion implantation" and U.S. Pat. No. 8,309,438 also to Colombo et al. entitled "Synthesizing graphene from metal-carbon solutions using ion implantation".

Carbon can also be provided in a desired amount into the second metal layer by depositing an amorphous carbon layer onto the top surface of the second metal layer 214 followed by an annealing process. The thickness of the amorphous carbon layer is generally a few nm thick, with the thickness sufficient to provide enough carbon atoms to compensate for the solubility limit in the metal and diffuse through. For any of the carbon source embodiments described above (second metal layer 214 with in-situ C pre-saturation, a C implanted second metal layer 214, or an amorphous carbon layer on top of the second metal layer 214), the second metal layer 214 film can then be annealed in the temperature range of 200° C. to 1000° C. for times ranging from 1 sec to 600 sec to form a grown-in graphite layer at an interface between the second metal layer and the graphene or CNT surface.

FIG. 2G shows a cross section view after annealing at a temperature >200° C., then cooling to room temperature by furnace cooling and fast cooling, such as at 100° C./s to form the graphitic interface layer 220. It should be noted that the deposition of the graphene layers can occur during the cool down from the annealing temperature or isothermally (constant temperature) depending upon the annealing temperature as noted above.

Figure 2H:
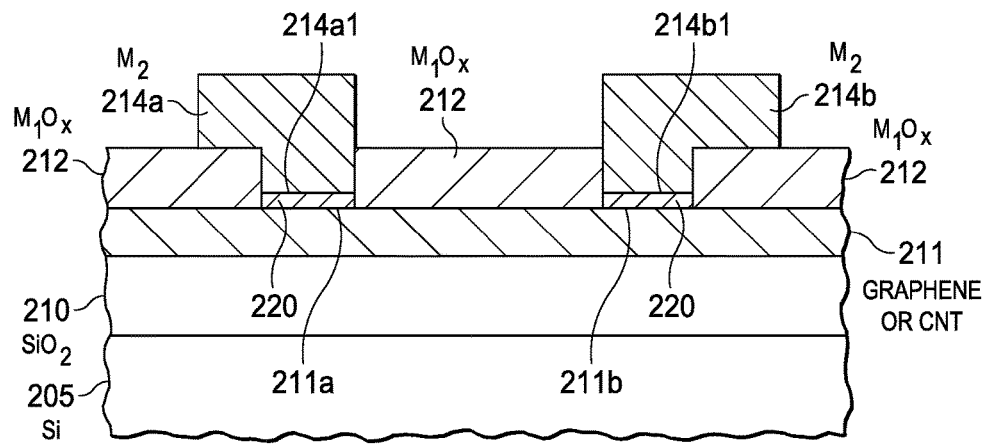

FIG. 2H describes a second process flow for forming a disclosed grown-in graphite layer 220 at an interface between the between the source contact 214a1 and graphene surface source contact 211a and between the drain contact 214b1 and graphene surface drain contact 211b that involves exposing the structure shown in FIG. 2E so that the second metal layer 214 is treated with a carbon precursor gas or vapor from a carbon precursor metal (e.g., methane, acetylene, ethanol or camphor) at a temperature >200° C., such as >600° C. In this process, carbon generated from the thermal decomposition of the carbon precursor gas diffuses through the second metal layer 214 to form the graphitic interface layer 220 shown.

As described above, in the case of LPCVD and PECVD, for example methane above its decomposition temperature decomposes to carbon and $H_2$, where the C diffuses from the surface of the Ni or other second metal layer 214 into the second metal layer 214 up to the metal's solubility limit, and at this point the C is uniformly distributed through the second metal layer. However, it is recognized once the C solubility limit for the particular metal is reached and more C is produced from methane or other C precursor gas decomposition, on the surface of the metal, C begins to precipitate out on the opposite side (graphene or CNT surface) because of isothermal supersaturation. At this point a C concentration gradient is set up and as long as the top second metal layer surface is exposed to the C from the precursor gas the process will continue and graphitic carbon will continue to precipitate at the second metal layer 214)/graphene interfaces. This enables the control of the number of graphene layers in a disclosed grown-in graphite layers by simply changing the annealing temperature and/or exposure time.

Additionally, the number of graphene layers can be controlled by exposing the second metal layer to C for different times when in the regime of C supersaturation. In this case, the number of graphene layers can formed by isothermal supersaturation of C in the second metal layer 214. The graphitic layers are thus formed by the diffusion and precipitation of C through the second metal layer 214 isothermally with the number of layers being controlled by the exposure time or annealing time depending on the type of C source. Exposure time refers to when carbon precursors are being used, while annealing time refers to when C is being deposited on the second metal layer.

As described above, the graphitic interface layer can be Bernal stacked with an ABAB type of stacking arrangement. In this arrangement, the carbon atoms in one sheet (A or B) are all $sp^2$ hybridized (C atoms attached to 3 groups and so is involved in 3 σ bonds, having 3 orbitals in the hybrid set). The C atoms in sheet B are typically offset from C atoms in sheet A by 60 degrees. The lateral thermal conductivity of Bernal stacked graphite is about 10 times >its out of plane thermal conductivity.

Regarding processing after forming grown-in graphite layer 210 at an interface between the between the source contact 214a1 and graphene surface source contact 211a and between the drain contact 214b1 and graphene surface drain contact 211b to form to complete a FET, contact to the substrate such as Si can be used to form a back gate. A top gate is also possible in addition to, or as an alternative to a back gate. A typical graphene FET can have dual-gate (top and back gate) control.

Figure 3:
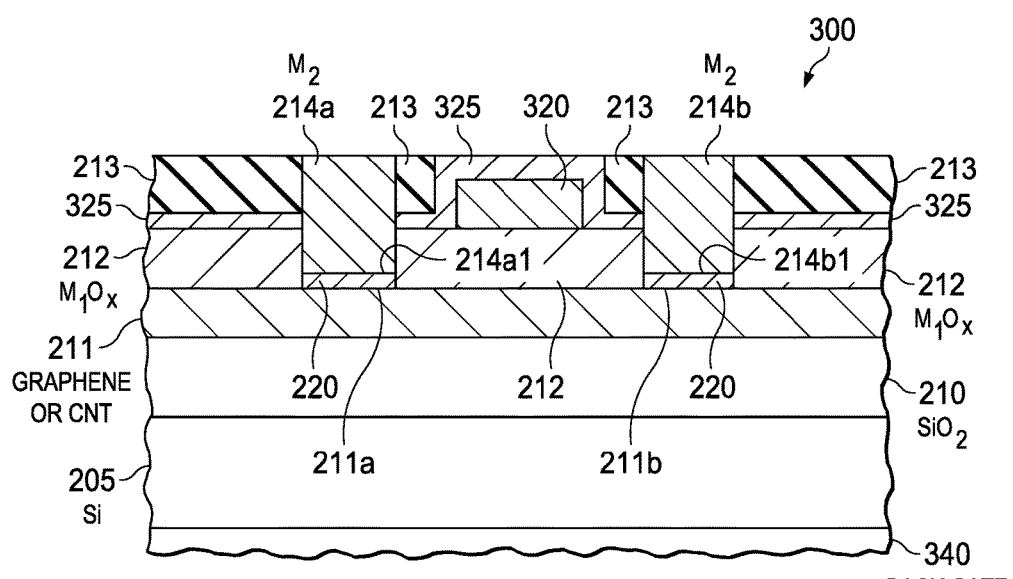
FIG. 3 is a cross sectional view of an example graphene or CNT FET having a graphitic interface layer at its S and D contacts, according to an example embodiment.

FIG. 3 is a cross section view of an example graphene or CNT FET (FET) 300 having both a top gate 320 and a back gate 340, according to an example embodiment. FET 300 includes a graphene or CNT layer 211 having a graphene surface source contact 211a and a graphene surface drain contact 21b on a substrate 205 shown as a silicon substrate having a $SiO_2$ layer 210 thereon. A gate dielectric layer provided by first metal oxide layer 212 is shown over a channel portion of the graphene or CNT layer 211. Instead, the first metal oxide layer 212 can be removed over the gate region and the gate dielectric layer can be a deposited gate dielectric layer such as comprising $Al_2O_3$, $HfO_2$, $Y_2O_3$, $SiO_2$, $ZrO_2$, $HfZrO_4$, SiON, h-BN, parylene, or perylene-3,4,9,10-tetra-carboxylic-dianhydride (PTCDA).

As decribed above the first metal oxide layer includes a first metal having work function (WF)<4.3 eV with open contact regions (contact regions) surface corresponding to the S and D surface contacts of the graphene or CNT layer 211. FET 300 includes a second metal layer portion 214a providing a S with a S contact 214a1 over the graphene surface S contact 211a and a second metal layer portion 214b providing a D with a D contact 214b1 over the graphene surface drain contact 211b. The second metal layer portions 214a, b includes a carbon concentration of at least $10^{17}$ atoms/cm$^3$. Although the second metal layer typically has a constant carbon concentration $\geq 10^{17}$ atoms/cm$^3$, in the case carbon is non-isotropically distributed throughout a thickness of the second metal layer, the second metal layer will provide an average carbon concentration $\geq 10^{17}$ atoms/cm$^3$. A graphitic interface layer 220 is between the second metal contacts and surface of the graphene or CNT surface 211. Enabled by a graphitic interface layer 220, contact resistivities for disclosed second metal contacts to the surface of the graphene or CNT surface 211 are generally from $1 \times 10^{-7}$ Ω-cm$^2$ to $5 \times 10^{-7}$ Ω-cm$^2$, which compares to the ulra-low contact resistivity of silicided Ni and Pt contacts to silicon described above ($10^{-8}$ Ω-cm$^2$).

The layer shown as 325 is a dielectric layer, such as comprising $SiO_2$, $Si_3N_4$, $HfO_2$, or $ZrO_2$. Although only a top or a bottom gate is needed, FET 300 is shown having both a top gate 320 and back gate 340 over the channel portion of the graphene or CNT layer 211. Although not shown, there will be a contact to the top gate 320.

Disclosed FETs can be discrete devices or arranged in an array. Disclosed FETs can be fabricated together with a variety of other circuitry on the same die.

Disclosed embodiments can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

What is claimed is:

1. A graphene field-effect transistor (FET), comprising:
    a graphene layer having a graphene surface on a substrate;
    a patterned first metal oxide including a first metal having a work function (WF) <4.3 eV with open surface contact regions (contact regions) including first and second regions of said graphene layer for providing a graphene surface source contact and a graphene surface drain contact, respectively;
    a second metal layer including a second metal layer portion providing a source with a source contact over said graphene surface source contact and a second metal layer portion providing drain with a drain contact over said graphene surface drain contact, wherein said second metal layer includes a carbon concentration of at least $10^{17}$ atoms/cm$^3$;
    a graphitic interface layer between said source contact and said graphene surface source contact and between said drain contact and said graphene surface drain contact, and
    at least one of a top gate and back gate structure over said channel portion of said graphene layer.

2. The FET of claim 1, wherein said first metal comprises Al, Ti, Hf, Zr, V, Y, la, Ce, Pr, Nd, Pm, Sm, Eu, Gd, Tb, Dy, Ho, Er, Tm, Yb, or Lu.

3. The FET of claim 1, wherein said second metal layer comprises Ni, Co, Cu, Ru, or Pd.

4. The FET of claim 1, wherein said substrate comprises silicon.

5. The FET of claim 1, wherein said graphene layer is in a form of carbon nanotube (CNTs).

6. The FET of claim 1, wherein said graphitic interface layer comprises two (2) to thirty (30) layers of graphene.

7. The FET of claim 1, wherein said graphitic interface layer is Bernal stacked.

8. A graphene field-effect transistor (FET), comprising:
   a graphene layer having a graphene surface on a substrate;
   a first metal oxide including a first metal with an open source contact region and an open drain contact region;
   a second metal including a first metal portion providing a source with a source contact over said graphene layer in the source contact region and a second metal portion providing drain with a drain contact over said graphene layer in the drain contact region, wherein said second metal includes a carbon concentration of at least $10^{17}$ atoms/cm$^3$;
   a graphitic interface layer between said source contact and said graphene layer and between said drain contact and said graphene layer, and
   at least one of a top gate and back gate structure over said portion of said graphene layer.

9. The FET of claim 8, wherein said first metal comprises Al, Ti, Hf, Zr, V, Y, la, Ce, Pr, Nd, Pm, Sm, Eu, Gd, Tb, Dy, Ho, Er, Tm, Yb, or Lu.

10. The FET of claim 8, wherein said second metal comprises Ni, Co, Cu, Ru, or Pd.

11. The FET of claim 8, wherein said substrate comprises silicon.

12. The FET of claim 8, wherein said graphene layer is in a form of carbon nanotube (CNTs).

13. The FET of claim 8, wherein said graphitic interface layer comprises two (2) to thirty (30) layers of graphene.

14. The FET of claim 8, wherein said graphitic interface layer is Bernal stacked.

15. A graphene field-effect transistor (FET), comprising:
   a graphene layer having a graphene surface on a silicon substrate;
   a first metal oxide including a first metal having a work function (WF)<4.3 eV with a first opening in a source contact region and a second opening in a drain contact region;
   a second metal including a first metal portion providing a source with a source contact over said graphene layer in the first opening and a second metal portion providing drain with a drain contact over said graphene layer in the second opening, wherein said second metal layer includes a carbon concentration of at least $10^{17}$ atoms/cm$^3$, and wherein said second metal layer comprises Ni, Co, Cu, Ru, or Pd;
   a graphitic interface layer between said source contact and said graphene layer and between said drain contact and said graphene layer, and
   at least one of a top gate and back gate structure over said portion of said graphene layer.

16. The FET of claim 15, wherein said first metal comprises Al, Ti, Hf, Zr, V, Y, la, Ce, Pr, Nd, Pm, Sm, Eu, Gd, Tb, Dy, Ho, Er, Tm, Yb, or Lu.

17. The FET of claim 16, wherein said second metal layer comprises Ni.

18. The FET of claim 15, wherein said graphene layer is in a form of carbon nanotube (CNTs).

19. The FET of claim 15, wherein said graphitic interface layer comprises two (2) to thirty (30) layers of graphene.

20. The FET of claim 15, wherein said graphitic interface layer is Bernal stacked.

* * * * *